(12) United States Patent
Xu et al.

(10) Patent No.: US 7,771,223 B2
(45) Date of Patent: Aug. 10, 2010

(54) ELECTRICAL CONNECTOR

(75) Inventors: Zhan-Jun Xu, ShenZhen (CN);
Been-Yang Liaw, Tu-cheng (TW);
Fu-Jin Peng, ShenZhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/317,861

(22) Filed: Dec. 29, 2008

(65) Prior Publication Data

US 2009/0170350 A1   Jul. 2, 2009

(30) Foreign Application Priority Data

Dec. 29, 2007   (CN) .................... 2007 2 0129846 U

(51) Int. Cl.
*H01R 13/62* (2006.01)
(52) U.S. Cl. ......................................... 439/331; 439/73
(58) Field of Classification Search .................. 439/331, 439/73
See application file for complete search history.

(56) References Cited

U.S. PATENT DOCUMENTS

| 6,438,831 | B1 * | 8/2002 | Hagihara | ..................... 29/884 |
| 7,234,955 | B1 | 6/2007 | Ho | |
| 7,240,426 | B2 * | 7/2007 | Totani et al. | .................. 29/840 |
| 7,241,161 | B2 | 7/2007 | Mar | |
| 2004/0097119 | A1 * | 5/2004 | Ma | ............................. 439/331 |
| 2007/0134963 | A1 * | 6/2007 | Janicke et al. | ............... 439/188 |

* cited by examiner

*Primary Examiner*—Tho D Ta
*Assistant Examiner*—Travis Chambers
(74) *Attorney, Agent, or Firm*—Andrew C. Cheng; Wei Te Chung; Ming Chieh Chang

(57) ABSTRACT

An electrical connector is for electrically connecting an electronic package with a circuit substrate. The connector includes a housing with a plurality of conductive terminals received therein, a fastening device for securing the electronic package. The fastening device includes a pressing member for pressing and securing the electronic package and a retaining member for securing the pressing member. At least one of the pressing member, the retaining member are produced from ferrite stainless steel material, and has a layer of high temperature resistant organic thin film thereon.

5 Claims, 3 Drawing Sheets

ELECTRICAL CONNECTOR

BACKGROUND OF THE INVENTION

1. Field of the Invention

The present invention relates to an electrical connector for electrically connecting an electronic package such as a central processing unit (CPU) with a circuit substrate such as a printed circuit board (PCB).

2. Description of Prior Art

A conventional electrical connector for electrically connecting a CPU (not shown) with a PCB (not shown) generally comprises a housing, a plurality of contacts and a fastening device assembled with the housing for securing the CPU. The fastening device generally comprises a pressing member for pressing the CPU and a retaining member for securing the pressing member. The retaining member is preliminarily assembled onto the housing then mounted onto the PCB, or the retaining member is directly positioned onto the PCB. Moreover, the retaining member may be of an integral manner or an assembled set, which has two or three separated parts. Conventional electrical connector as described above are found in U.S. Pat. No. 7,234,955 issued to Ho on Jun. 26, 2007 and U.S. Pat. No. 7,241,161 issued to Ma on Jul. 10, 2007.

The fastening device of conventional electrical connector is generally formed from metal material, such as iron, austenitic stainless steel, the price of which is usually higher, hence producing a high cost for producing the electrical connector. Furthermore, electrical connection between the fastening device and the housing will be affected because of lower capability of corrosion resistance of the fixed device.

In view of the above, an improved electrical connector that overcomes the above-mentioned disadvantages is desired.

SUMMARY OF THE INVENTION

Accordingly, an object of the present invention is to provide an electrical connector for electrically connecting an electronic package such as a central processing unit (CPU) with a circuit substrate such as a printed circuit board (PCB), which can prevent the fastening device from rust.

To achieve the above-mentioned object, an electrical connector in accordance with a preferred embodiment of the present invention is for electrically connecting a CPU with a PCB. The connector includes a housing with a plurality of conductive terminals received therein, a fastening device for securing the electronic package. The fastening device includes a pressing member for pressing and securing the electronic package and a retaining member for securing the pressing member. At least one of the pressing member, the retaining member are produced from ferrite stainless steel material, and has a layer of high temperature resistant organic thin film thereon. Thereby, a lower cost and a higher rustproof effect are achieved.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 1:
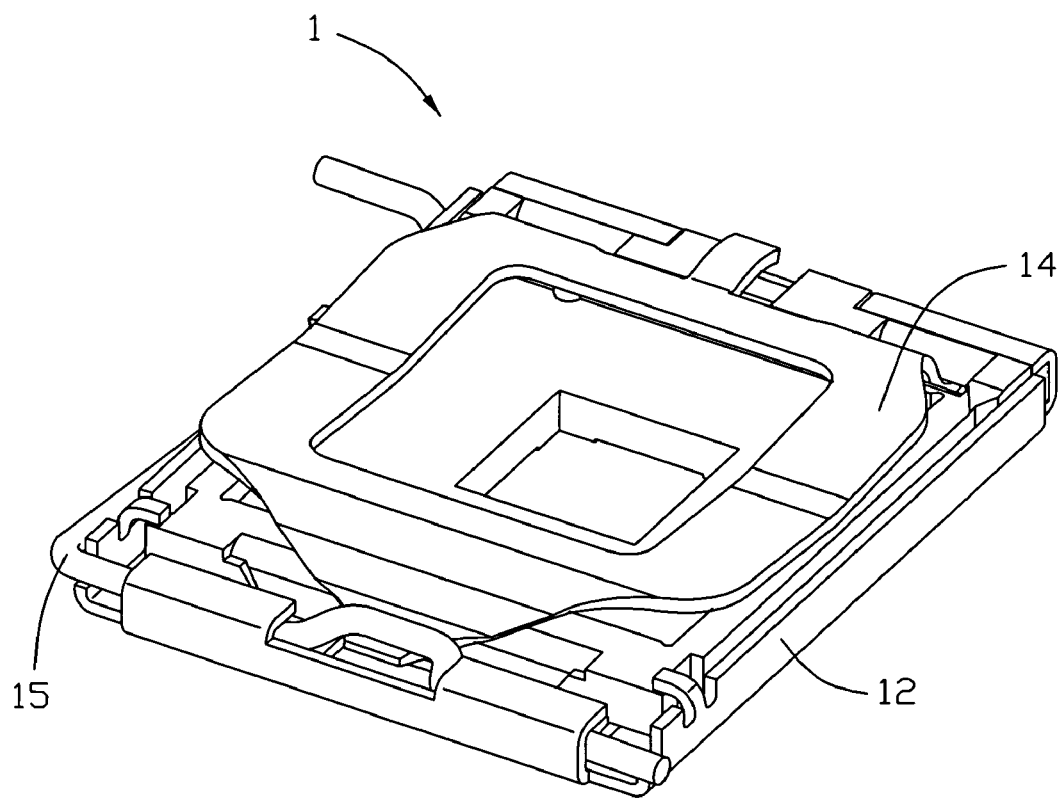
FIG. 1 is an assembled, isometric view of an electrical connector in accordance with the preferred embodiment of the present invention.
Figure 2:
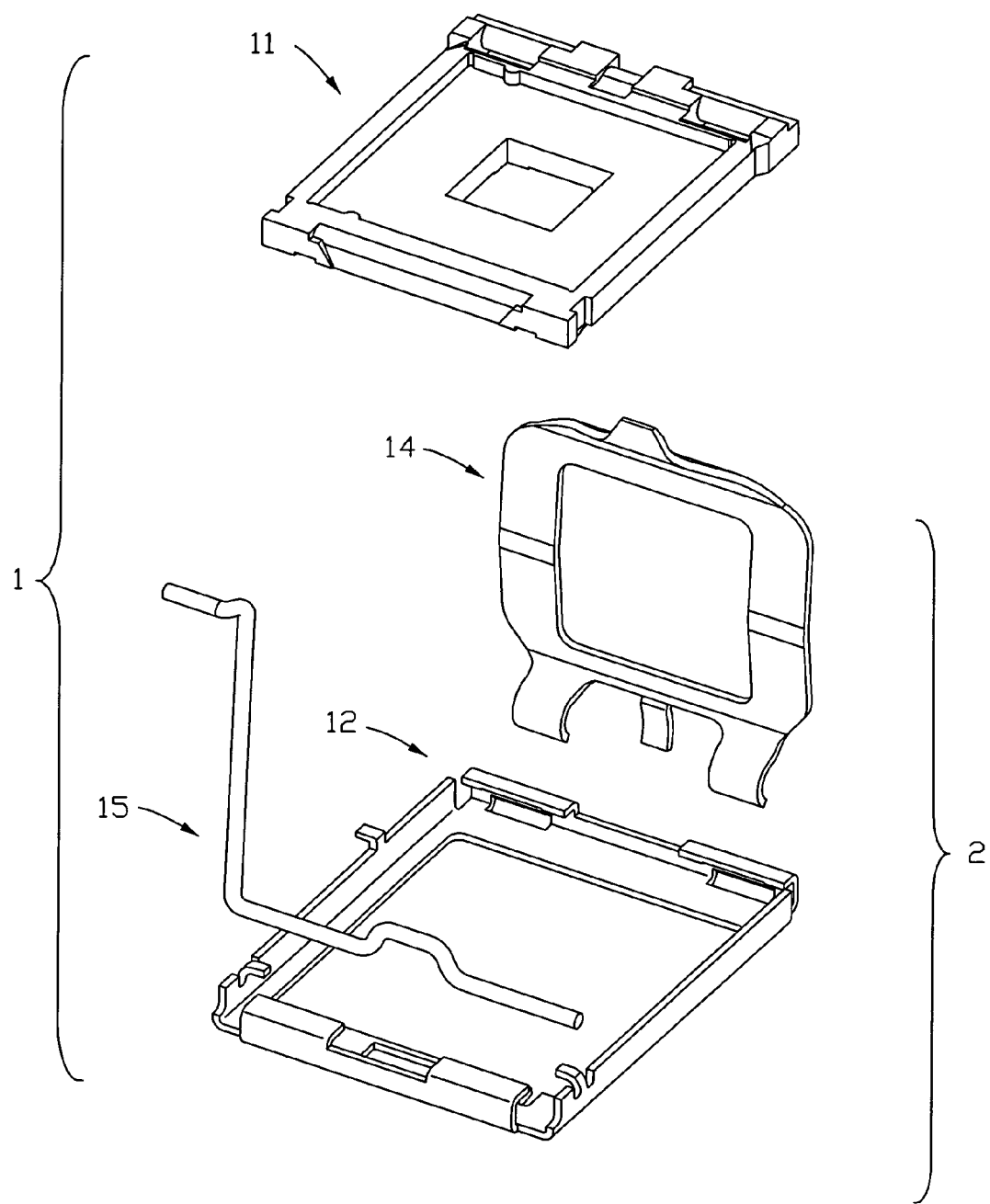
FIG. 2 is an exploded, isometric view of the electrical connector of FIG. 1.

Referring to FIGS. 1-2, an electrical connector 10 in accordance with the preferred embodiment of the present invention is used for electrically connecting an electrical package (not shown) with a printed circuit board (PCB) (not shown). The connector 1 comprises an insulative housing 11 with a plurality of conductive terminals (not shown) received therein, a fastening device 2 assembled with the housing 11. The fastening device 2 comprises a retaining member (a base 12) surrounding the housing 11 and a pressing member assembled with the base 12. The pressing member comprises a load plate 14 pivoted assembled to one side of the base 12 and a load lever 15 pivoted assembled to the base 12. The fastening device 2 is used for securing the electrical package in the housing 11.

Figure 3:
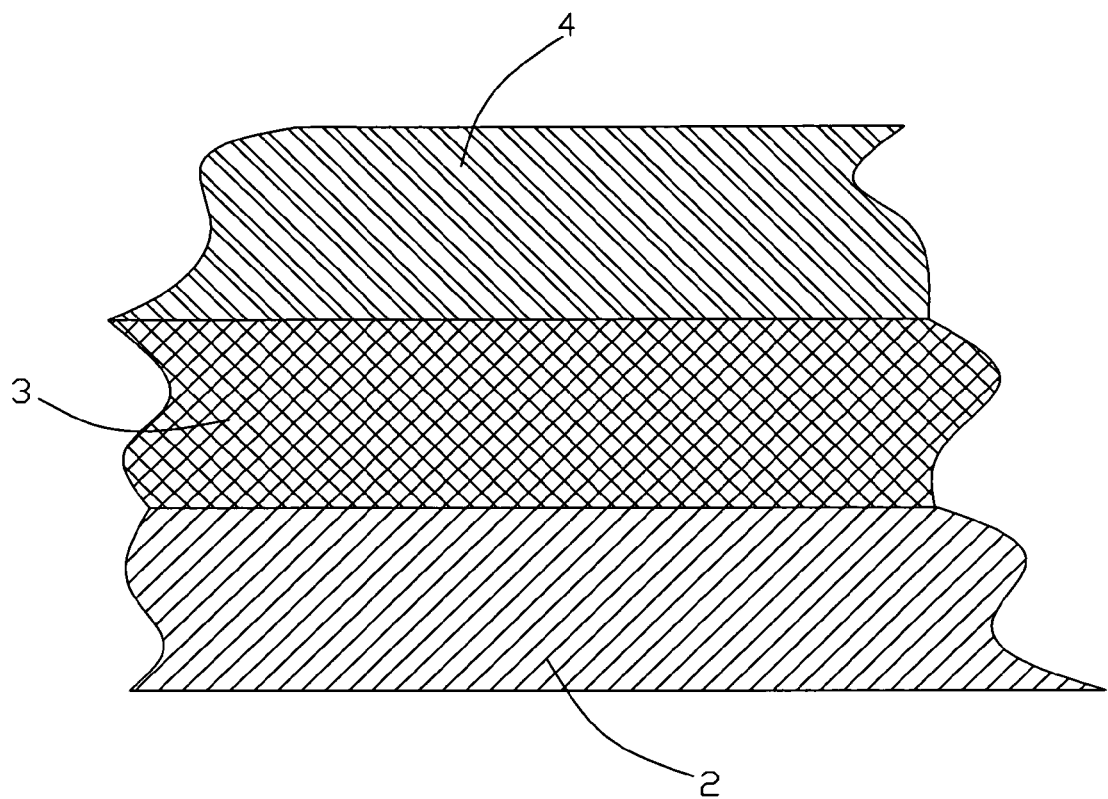
FIG. 3 is a perspective view of a high temperature resistant organic thin film layer of one component of the electrical connector.

Referring to FIG. 3, in the embodiment of the invention, at least one of the retaining member and the pressing member of the fastening device 2 is made of ferrite stainless steel metal materials (e.g. SUS430, SUS 434, SUS 436) with a high temperature resistant organic thin film layer 4 is provided on outer surface thereof. Material of the high temperature resistant organic thin film layer 4 can be selected from such material: silicones, perfluoropolyethers, Perfluoroethers and polyphenyl ethers. In addition, the high temperature resistant organic thin film layer 4 can be choosey plated on one of the load plate 14, and the load lever 15 made of metal materials, or two of them.

By using capacity of lower cost of the ferrite stainless steel materials, made cost is effectively reduced. In addition, generally, chromic oxide 3 on surface of ferrite stainless steel materials will be destroyed to an incontinuous status when the ferrite stainless steel material is under processed, thus making the ferrite stainless steel prone to rust. In this embodiment, high temperature resistant organic thin film layer 4 is plated on the surface of the surface of the fastening device 2 and can covers said incontinuous area/point. Thereby, a higher rustproof effect is achieved.

While the preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector for electrically connecting an electronic package with a circuit substrate, comprising:
   an insulative housing with a plurality of conductive terminals received therein;
   a fastening device cooperated with the housing for securing the electronic package, comprising:
   a pressing member for pressing and securing the electronic package; and
   a retaining member for securing the pressing member; wherein
   at least one of the pressing member and the retaining member is produced from ferrite stainless steel material, and has a layer of high temperature resistant organic thin film thereon under condition that said layer of high temperature resistant organic thin film is directly exposed to an exterior.

2. The electrical connector as claimed in claim 1, wherein material of the layer can be selected from: silicones, perfluoropolyethers, Perfluoroethers and polyphenyl ethers.

3. The electrical connector as claimed in claim 1, wherein the ferrite stainless steel material may be SUS430, SUS 434 or SUS 436.

4. The electrical connector as claimed in claim 1, wherein the pressing member and the retaining member are produced from ferrite stainless steel material.

5. The electrical connector as claimed in claim 4, wherein each of the pressing member and the retaining member has the layer thereon.

\* \* \* \* \*